United States Patent [19]

Kosinski

[11] Patent Number: 5,153,476

[45] Date of Patent: Oct. 6, 1992

[54] ACOUSTIC VIBRATOR WITH VARIABLE SENSITIVITY TO EXTERNAL ACCELERATION

[75] Inventor: John A. Kosinski, Wall Township, Monmouth County, N.J.

[73] Assignee: The United States of America as represented by the Secretary of the Army, Washington, D.C.

[21] Appl. No.: 667,698

[22] Filed: Mar. 11, 1991

[51] Int. Cl.$^5$ .......................................... H01L 41/08
[52] U.S. Cl. ........................... 310/313 R; 310/313 B; 310/361; 310/365; 310/366; 310/316; 310/317; 310/326; 310/329; 310/338; 333/151; 333/154
[58] Field of Search ............... 310/313 R, 313 B, 361, 310/365, 366, 329, 338, 316, 317, 326; 73/514, 517 R, 517 AV; 333/151, 154

[56] References Cited

U.S. PATENT DOCUMENTS

| | | | |
|---|---|---|---|
| 3,833,867 | 9/1974 | Solie | 333/151 |
| 4,357,553 | 11/1982 | Minagawa et al. | 310/313 B |
| 4,398,114 | 8/1983 | Minagawa et al. | 310/313 R |
| 4,453,141 | 6/1984 | Rosati | 333/158 |
| 4,583,019 | 4/1986 | Yamada et al. | 310/360 |
| 4,636,678 | 1/1987 | Ballato | 310/313 R |
| 4,697,115 | 9/1987 | Mitsutsuka | 310/313 R |
| 4,745,378 | 5/1988 | Niitsuma et al. | 310/313 B |
| 4,836,882 | 6/1989 | Ballato | 156/626 |
| 4,837,475 | 6/1989 | EerNisse et al. | 310/312 |
| 4,900,969 | 2/1990 | Mitsutsuka et al. | 310/313 B |

FOREIGN PATENT DOCUMENTS

| | | | |
|---|---|---|---|
| 56-35482 | 4/1981 | Japan | 310/366 |
| 0280965 | 3/1990 | Japan | 73/517 R |
| 0898590 | 1/1982 | U.S.S.R. | 333/151 |

OTHER PUBLICATIONS

Ballato et al., "Electronic Desensitization of Resonators to Accelerations", 44th Annual Symposium on Frequency Control, U.S. Army Electronics Tech. & Devices Laboratory, pp. 444-451.

Smythe & Horton, "Adjustment of Resonator G-Sensitivity by Circuit Means", 44th Annual Symposium on Frequency Control, Piezo Technology Inc., Orlando, IEEE (1990), pp. 437-443.

Lee & Guo, "Acceleration Sensitivity of Crystal Resonators Affected by the Mass and Location of Electrodes", 44th Annual Symposium on Frequency Control, Dept. of Civil Engineering & Operation Research, Princeton, IEEE (1990), pp. 468-473.

Errol P. EerNisse et al., "Variational Method for Modeling Static and Dynamic Stresses in a Resonator Disc with Mounts", 43rd Annual Symposium on Frequency Control, Quartztronics, Inc., IEEE (1989), pp. 377-387.

Primary Examiner—Mark O. Budd
Assistant Examiner—Thomas M. Dougherty
Attorney, Agent, or Firm—Michael Zelenka; William H. Anderson; Raymond M. Saunders

[57] ABSTRACT

Biasing electrodes on a piezoelectric acoustic vibrator alter the sensitivity of the acoustic vibrator and can be used to compensate for external stresses applied to the acoustic vibrator. The biasing electrodes and the circuitry providing electric signals to them are separate from the RF circuitry feeding the RF signal electrodes of the acoustic vibrator. Biasing electrodes can be used on bulk acoustic wave devices or surface acoustic wave devices. The biasing electrodes can be energized by a static D.C. voltage source, or can be used in a dynamic biasing arrangement to provide instantaneous compensation for changing environmental conditions.

16 Claims, 3 Drawing Sheets

ACOUSTIC VIBRATOR WITH VARIABLE SENSITIVITY TO EXTERNAL ACCELERATION

TECHNICAL FIELD

The present invention relates generally to acoustic vibrators used for frequency control and selection, and more particularly to piezoelectric resonators having variable sensitivity and compensation for external acceleration effects.

BACKGROUND ART

Acoustic resonators for precise selection and control of radio frequencies are well known in high sensitivity sensor circuitry, such as accelerometers. The two most common types of acoustic vibrators are the bulk acoustic wave devices (BAW) and surface acoustic wave devices (SAW).

A perspective view and a side view of a typical BAW are shown in FIGS. 1 and 2 respectively. The BAW includes a piezoelectric plate as a substrate 100, a top electrode 102 on one surface of the substrate and a bottom electrode 104 on the opposite surface. When the electrodes 102, 104 are energized, usually by RF signals, an electric field is created. The mechanical forces inherent to the electric field stress the piezoelectric substrate producing a pattern of strain known as a mechanical mode shape.

The alternating RF signal creates vibration in the mechanical mode shape, resulting in acoustic waves. The acoustic waves travel through the thickness of the piezoelectric plate, reflecting at the surfaces and setting up standing waves throughout the interior of the plate. The acoustic waves are confined essentially to the active region 106 between the two electrodes 02, 104, and drop off sharply outside of the region occupied by the electric field created by the energized electrodes 102, 104. The frequency of a BAW is expressed approximately as $$f_{Ao} = \frac{n}{2 \cdot t} \sqrt{\frac{c}{\rho}}$$

where
  n is the overtone number, an odd integer (1, 3, 5 . . .)
  t is the plate thickness
  $\rho$ is the material density
  c is the piezoelectrically stiffened elastic constant In general, n, t and $\rho$ will be invariant during operation. However, $\bar{c}$ may vary as the result of a number of factors, thus altering the frequency of the BAW.

A typical surface acoustic wave device (SAW), is shown in FIG. 3. Energized electrodes create a mechanical mode shape and resulting acoustic waves, similar to a BAW. However, the electrodes 202, 204 of a SAW are arranged on only one side of piezoelectric substrate 200, and the acoustic waves are confined to the surface of the substrate 200 having the electrodes. As with the BAW, the RF signal electrodes are arranged in sets. However, the acoustic waves travel only in the area of the surface of the piezoelectric substrate bounded by RF signal electrodes 202, 204 and grating reflectors 206. The edges of the substrate outside this area are essentially at rest.

The first set of electrodes 202 is fed by a voltage source 208 and the second set of electrodes 204 is grounded. The electrodes are configured to have bus bars such as 202b, 204b and fingers such as 202a, 204a. The electrode sets 202, 204 are interdigitated as shown so that acoustic waves move from the fingers of one electrode set to adjacent fingers of the second electrode set. The grating reflectors 206 are used to control the extent of acoustic wave propagation over the surface of the piezoelectric substrate. Additional sets of electrodes 210, 212 and grating reflectors 214 can be arranged on the surface of the piezoelectric substrate according to the demands of the system containing the SAW.

The frequency of a SAW is roughly expressed as:

$$f = \frac{1}{4d} \sqrt{\frac{c}{\rho}}$$

where d is the inter-digitated finger spacing for both the interdigitated transducers (IDT) and the grating reflectors, $\bar{c}$ is similar to the piezoelectrically stiffened elastic constant used in the formula for the BAW, and $\rho$ is similar to the constant used in the formula for the BAW.

As in a BAW, the factors d and $\rho$ are essentially during operation. However, the elastic stiffness, $\bar{c}$, may vary as the result of other factors, thus altering the frequency of the SAW.

In both BAW and SAW devices, a mechanical mode shape is, in part, determined by the elastic stiffness, $\bar{c}$, of the piezoelectric substrate. In turn, the mechanical mode shape when combined with all the stresses exerted on the piezoelectric substrate determines the precise frequency at which the device will operate.

Under static conditions all the stresses applied to the piezoelectric substrate are accounted for by the mechanical mode shape which remains constant during operation. However, additional stresses can be introduced when the piezoelectric substrate is accelerated, decelerated or vibrated. Since high precision circuitry using acoustic vibrators is often needed in violently moving vehicles, such as helicopters, compensation for external acceleration becomes critical. Since acoustic vibrators are also used in accelerometers, variable sensitivity is necessary to quickly adjust to rapidly changing external conditions.

The prior art teaches a number of methods of compensating for stresses caused by external acceleration. One technique is to add or delete material from the electrodes altering the mechanical mode shape. Examples of such techniques are found in U.S. Pat. Nos. 4,837,475 and 4,836,882.

Another technique uses alteration of the operating frequency to change the mechanical mode shape and thus compensate for external stresses. An example of this technique is found in the publication by Ballato et al entitled, "ELECTRONIC DESENSITIZATION OF RESONATORS TO ACCELERATIONS", Forty-Fourth Annual Symposium on Frequency Control, U.S. Army Electronics Tech. & Devices Laboratory, pp. 444–451.

In yet another technique, additional multi-electrode structures are used to vary mechanical mode shape and thus alter sensitivity to external accelerations. An example of this technique is found in the publication by Smythe & Horton entitled, "ADJUSTMENT OF RESONATOR G-SENSITIVITY BY CIRCUIT MEANS", Forty-Fourth Annual Symposium on Frequency Control, Piezo Technology, IEEE (1990), pp. 437–443.

A further technique includes calculating optimal electrode masses and configurations for certain types of acceleration, and limiting the design of the acoustic vibrators to only those configurations having the least acceleration sensitivity. An example of this technique is found in the publication by Lee and Guo entitled "ACCELERATION SENSITIVITY OF CRYSTAL RESONATORS AFFECTED BY THE MASS AND LOCATION OF ELECTRODES", Forty-Fourth Annual Symposium on Frequency Control, Dept. of Civil Engineering & Operation Research, IEEE (1990), pp. 468–473.

Each of the aforementioned systems suffers from lack of flexibility. For some there are severe limitations in usable frequencies or electrode configurations. Rapidly and easily altering acoustic vibrator sensitivity is problematical for all of them.

A more adaptable system providing rapid compensation to external stresses is taught in U.S. Pat. No. 4,453,141, to Rosati, using a dynamic suppression system for doubly-rotated cut quartz BAW resonators. This system detects externally induced vibrations on the piezoelectric substrate and generates an electrical signal which is a replica of the vibration acting on the substrate. The electrical signal is thereafter modified and applied directly to the RF electrodes to immediately compensate for the externally induced vibrations. An isolation network is necessary for the proper operation of this system, as is a doubly-rotated cut quartz substrate. The Rosati system depends on "electroelastic" operation and so cannot be used with singly rotated cut quartz. This system is also not adaptable to SAW devices, and cannot use many electrode configurations.

DISCLOSURE OF THE INVENTION

One object of the present invention is to quickly and efficiently compensate for stresses caused by external acceleration on an acoustic vibrator.

Another object is to operate a responsive variable sensitivity acoustic vibrator.

Yet another object is to rapidly vary sensitivity for both SAW and BAW devices, having a wide variety of electrode configurations, operating frequencies, and employing both singly rotated cut and doubly-rotated cut quartz.

A further object is to compensate for stress caused by external acceleration on an acoustic vibrator without altering mechanical mode shape or operating frequency of the acoustic vibrator.

Still a further object of the invention is to remove any chance of interference between radio frequency signals and stress compensating signals.

According to the present invention, an acoustic vibrator subject to external stresses includes a substrate, a first electrode means for creating a mechanical mode pattern using the substrate material and a second electrode means for generating bias stresses. The mechanical mode pattern has a predetermined characteristic frequency which is not changed by the stresses generated by the second electrode means to compensate for external stresses applied to the substrate.

BRIEF DESCRIPTION OF DRAWINGS

FIG. 7 is a top view of a bulk acoustic wave device showing stress bias vectors.

BEST MODE

Figure 1:
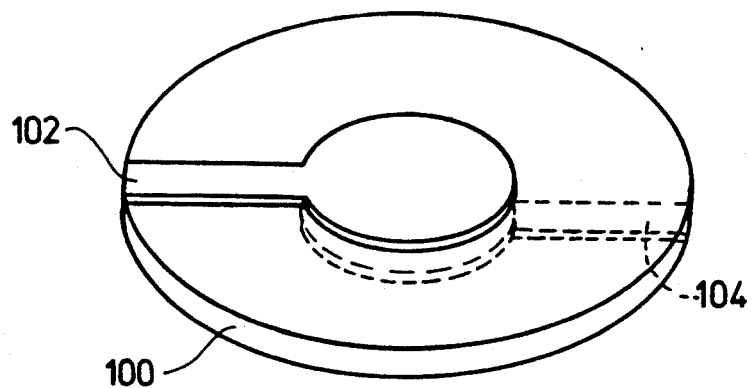
FIG. 1 is a perspective view of a bulk acoustic wave device.
Figure 2:
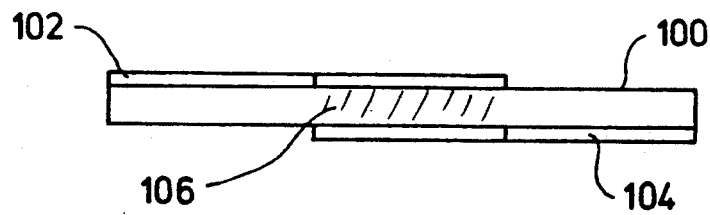
FIG. 2 is a side view of a bulk acoustic wave device.
Figure 3:
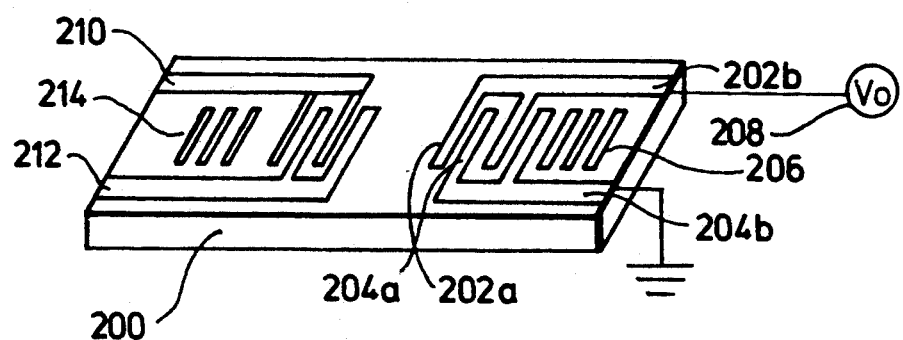
FIG. 3 is a perspective view of a surface acoustic wave device.
Figure 4:
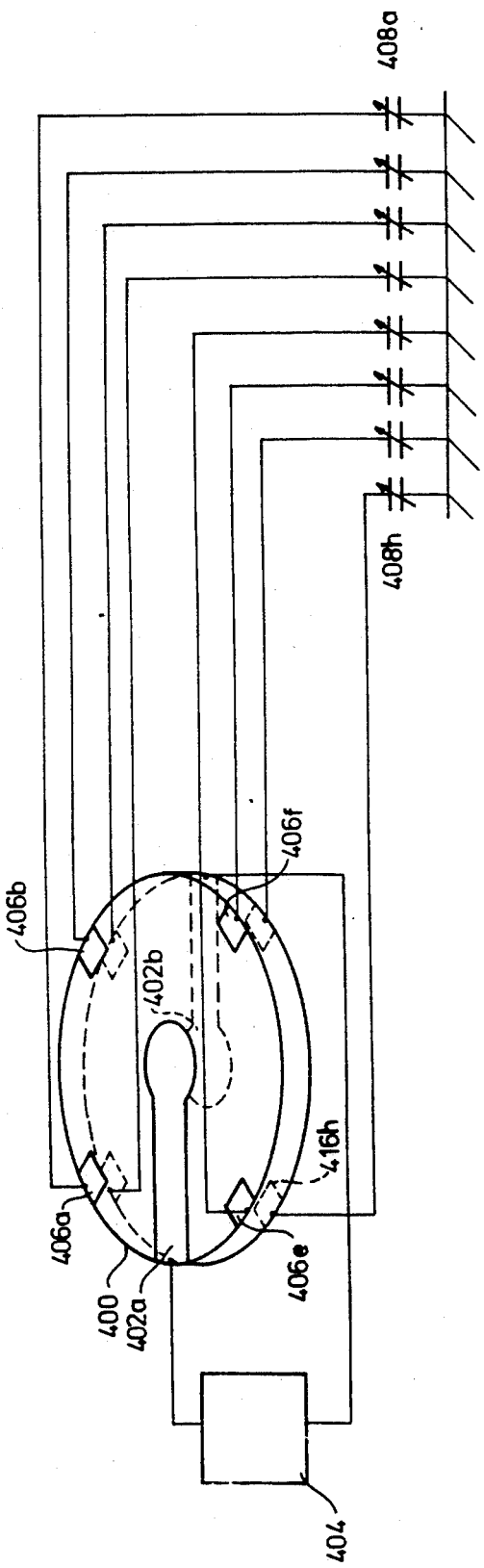
FIG. 4 is a perspective view of the present invention, showing a static biasing arrangement.

FIG. 4 shows an embodiment of the present invention applied to a BAW resonator. RF signal electrodes 402A and 402B are mounted on opposite sides of piezoelectric substrate 400. The RF electrodes are fed by RF oscillator circuit 404 in a manner common to conventional BAW devices. A series of biasing electrodes 406A-H is mounted around the edges of the upper and lower major surfaces of substrate 400. Electrodes 406A-H are individually biased by adjustable DC sources 408A-H.

Biasing electrodes 406A-H, when energized, produce additional stresses within the piezoelectric substrate 400. These stresses do not interfere with the mechanical mode shape which is confined to the region between the two RF electrodes 402A and 402B. However, the additional stresses are effective to offset stresses introduced by external acceleration forces applied to the substrate.

The configuration of biasing electrodes 406A-H can be tailored for any shape of piezoelectric substrate, and can be arranged to allow imposition of biasing stresses in virtually any direction by the proper choice of potentials and polarities of the voltages applied to the biasing electrodes 406A-H. An important aspect of the invention is that the RF signals applied to the electrodes 402A, 402B need not be altered to compensate for externally applied stresses since the biasing stress electrodes provide all the stress vectors necessary for compensation.

Different types of piezoelectric material are affected differently by the stresses applied to them. Consequently, some materials are unsuitable for use at certain frequencies or in certain environments or with certain electrode configurations. The most common material used in piezoelectric devices is quartz. The properties of quartz devices depend on the cut or orientation from which the device is made. The most commonly available quartz is generically known as singly rotated cut quartz. These types of quartz include AT and BT type cuts. Another type of quartz is known as doubly rotated cut quartz. An example of a doubly rotated cut quartz is an SC cut quartz crystal. The present invention can be used with both singly rotated cut and doubly rotated cut crystals.

The static biasing arrangement in FIG. 4 is adjusted by first measuring the RF output from RF electrodes 402A, 402B when the vibrator is subjected to a known externally-induced vibration or acceleration. The DC biases are then adjusted to compensate for the effects of the externally-induced stresses. The DC biases may also be adjusted to vary the acceleration sensitivity of the acoustic vibrator so that it may respond to externally introduced stresses and the use as an accelerometer. Because of the variable biasing electrode arrangement allowed by the present invention, virtually any particular vector of stress can be compensated for (or enhanced by the case of accelerometers) by the proper biasing.

A particularly effective arrangement for generating compensating stress vectors in almost any direction is shown in FIG. 7, a top view of an electrode arrangement similar to that in FIG. 4. Pairs of stress biasing electrodes 706, 708 and 710, 712 generate orthogonal lines of stress 720, 730. More than one pair of orthogonal lines of stress can be generated. However, biasing fields may be generated across the active region between overlapped RF signal electrodes 702, 704. In some cases this may interfere with the mechanical mode shape produced by electrodes 702, 704.

Figure 5:
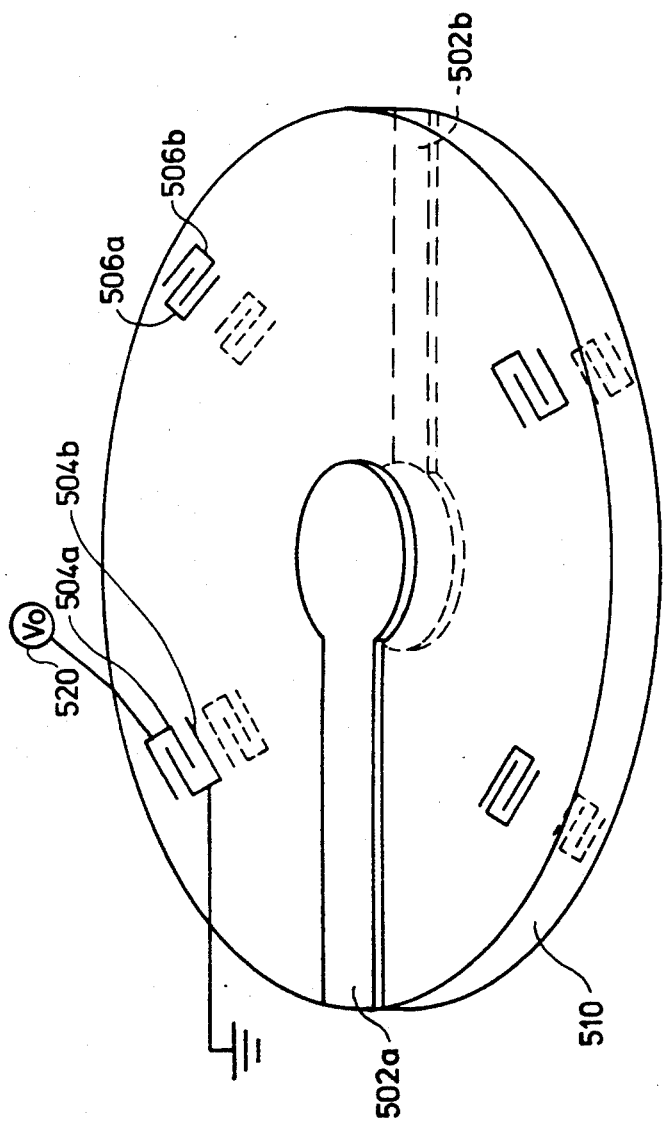
FIG. 5 is a perspective view of the present invention having interdigitated biasing electrodes.

This situation can be avoided by the use of interdigitated electrodes used as biasing electrodes as shown in FIG. 5. Interdigitated biasing electrodes 504A and 504B are similar to those used on SAW devices. However, they are not used as part of the RF signal circuitry. Each set of interdigitated electrodes 504A, 504B is connected as shown in FIG. 5 with one electrode 504A connected to a voltage source 520 and the other electrode 504B connected to ground potential. Other interdigitated sets of electrodes 506A, 506B are arranged in the same configuration as that shown in FIG. 4.

The interdigitated biasing electrodes of FIG. 5 also lend themselves to dynamic biasing using a time-varying biasing field. Dynamic biasing is well known and a variety of sensing and feed-back circuits are available. An example of such circuitry is shown in the Rosati patent incorporated herein by reference. An important factor of the present invention is that the feed-back circuitry connected to the biasing electrodes is separate from the RF signal generator connected to the RF signal electrodes. Since the sensing circuitry supplies a constant stream of information in the form of error signals to the feed-back circuit, constant compensation to varying conditions is made by the biasing electrodes. As a result, instantaneous frequency variations can be reduced to zero. The separation of the two types of circuitry prevent interference between the RF signals and the biasing voltage.

Figure 6:
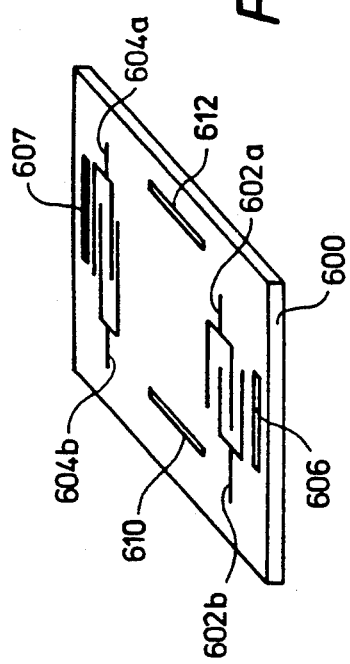
FIG. 6 is another aspect of the present invention used on a surface acoustic wave device.

The present invention is equally applicable to a SAW device as shown in FIG. 6. SAW devices provide for a greater variety of electrode configurations, frequency variations and uses other than BAW devices. The piezoelectric substrate 600 in FIG. 6 contains two sets of RF signal electrodes 602A, 602B and 604A, 604B. However, more sets of RF signal electrodes can be used depending upon substrate and system requirements. Biasing electrodes 606, 607, 610 and 612 are located along the periphery of the piezoelectric substrate 600. The biasing electrodes may be arranged to enclose the entire periphery of this substrate. The biasing electrodes may also be located on the opposite side of the substrate from the RF signal electrodes.

Although not shown, separate signal sources are connected to the RF signal electrodes and the biasing electrodes. voltages applied to the biasing electrodes 606, 607, 610 and 612 will be determined by a dynamic biasing system responsive to changing environmental conditions producing stresses on piezoelectric substrate 600. Signals applied to the RF signal electrodes 602A and 602B and 604A and 604B are not altered in response to externally-applied stresses.

Although a number of arrangements of the invention have been mentioned by way of example, it is not intended that the invention be limited thereto. Accordingly, the invention should be considered to include any and all configurations, modifications, variations, combinations or equivalent arrangements falling within the scope of the following claims.

What is claimed is:

1. An acoustic vibrator subject to external stresses comprising:
   a substrate;
   first electrode means arranged on said substrate for creating a mechanical mode shape of said substrate, said mechanical mode shape having a predetermined characteristic frequency in the absence of external stresses, said first electrode means being electrically connected to a first external means for supplying a first group of signals; and
   second electrode means electrically connected to a second external means for supplying a second group of signals, said first and second external means being separate from each other, said second electrode means arranged on said substrate for generating bias stresses by application of electrical bias signals, said second electrode means being arranged around the first electrode means such that said electrical bias signals do not effect said mechanical mode shape, said second electrode means arranged to detect external stress on said substrate and adjust said biasing signals in response thereto;
   wherein frequency perturbations caused by external stresses are compensated for by said electrical bias voltages applied to said second electrode means.

2. The acoustic vibrator of claim 1 wherein said substrate comprises piezoelectric material.

3. The acoustic vibrator of claim 2 wherein said first group of signals comprises RF signals.

4. The acoustic vibrator of claim 3 wherein said second group of signals comprise DC bias signals.

5. The acoustic vibrator of claim 4, wherein said second external means comprises at least one independently adjustable DC source, and said second electrode means for generating bias stresses comprises. a plurality of bias electrodes arranged on said substrate in a predetermined manner, each said bias electrode being connected to a single independently adjustable DC source.

6. The acoustic vibrator of claim 5, wherein said bias electrodes are arranged to provide stress bias along at least two mutually orthogonal lines.

7. The acoustic vibrator of claim 3 wherein said second group of signals comprise AC biasing signals.

8. The acoustic vibrator of claim 7, wherein said AC biasing signals are dynamically adjusted.

9. The acoustic vibrator of claim 8 wherein said second electrode means for generating bias stresses comprises a plurality of interdigitated electrodes arranged on said substrate.

10. The acoustic vibrator of claim 9 wherein said interdigitated electrodes are arranged to provide stress bias along at least two mutually orthogonal lines.

11. The acoustic vibrator of claim 1 wherein said substrate and said first electrode means for creating a mechanical mode pattern are arranged as a bulk acoustic wave device.

12. The acoustic vibrator of claim 1 wherein said substrate and said first electrode means for creating a mechanical mode pattern are arranged as a surface acoustic wave device.

13. The acoustic vibrator of claim 12 wherein said substrate further comprises first and second major surfaces, each having a periphery, wherein said first electrode means for creating a mechanical mode shape are arranged on said first major surface of said substrate and said second electrode means for generating bias stress are arranged on said first major surface of said substrate.

14. The acoustic vibrator of claim 13 wherein said second electrode means for generating bias stress are arranged along the periphery of said first major surface of said substrate.

15. The acoustic vibrator of claim 12 wherein said substrate further comprises first and second major surfaces, each having a periphery, wherein said first electrode means for creating a mechanical mode shape are arranged on said first major surface of said substrate and said second electrode means for generating bias stress are arranged on said second major surface of said substrate.

16. The acoustic vibrator of claim 15 wherein said second electrode means for generating bias stresses is arranged along the periphery of said second major surface of said substrate.

* * * * *